(12) United States Patent
Matsuura

(10) Patent No.: US 7,260,143 B2
(45) Date of Patent: Aug. 21, 2007

(54) TUNER FOR USE IN CABLE MODEM AND CABLE MODEM INCLUDING THE TUNER

(75) Inventor: Shuuji Matsuura, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 729 days.

(21) Appl. No.: 10/648,360

(22) Filed: Aug. 27, 2003

(65) Prior Publication Data

US 2005/0193424 A1    Sep. 1, 2005

(30) Foreign Application Priority Data

Dec. 26, 2002  (JP)  ............................. 2002-378345

(51) Int. Cl.
*H04B 1/38* (2006.01)
(52) U.S. Cl. ..................................... 375/222
(58) Field of Classification Search ............... 375/222, 375/376, 211; 725/105, 111; 438/307, 379; 327/157
See application file for complete search history.

(56) References Cited

U.S. PATENT DOCUMENTS 6,698,022 B1 * 2/2004  Wu ............................ 725/111
6,931,659 B1 * 8/2005  Kinemura .................... 725/111
2002/0056134 A1 * 5/2002  Abe et al. .................... 725/120
2003/0031198 A1 * 2/2003  Currivan et al. ............. 370/465
2003/0106067 A1 * 6/2003  Hoskins et al. ............. 725/119

FOREIGN PATENT DOCUMENTS

JP          5-14058 A       1/1993

* cited by examiner

*Primary Examiner*—Khai Tran
(74) *Attorney, Agent, or Firm*—Birch, Stewart, Kolasch & Birch, LLP

(57) ABSTRACT

A tuner for use in a cable modem of the present invention includes a reception processing section for processing downstream signals supplied from a cable line and a return path circuit for processing upstream signals outputted from the cable modem toward the cable line, and the return path circuit is provided with a return path amplification circuit 58. This makes it possible to reduce development costs and development time for the tuner as well as to realize downsizing of the cable modem itself and improvement in transmission characteristic.

11 Claims, 5 Drawing Sheets

TUNER FOR USE IN CABLE MODEM AND CABLE MODEM INCLUDING THE TUNER

CROSS-REFERENCE TO RELATED APPLICATION

The present application claims priority under 35 U.S.C. §119 to Japanese Patent Application No. 2002-378345, filed Dec. 26, 2002, the entire disclosure of which is hereby incorporated by reference.

FIELD OF THE INVENTION

The present invention relates to a tuner for use in a cable modem which is used in carrying out data communication in a cable connection system using a communication line of a cable television network, for example.

BACKGROUND OF THE INVENTION

In recent years, with the improvement of communication infrastructure, large-volume data such as music data and video data have been transmitted/received using the Internet. In such a circumstance, because of increasing demand for an environment where high-speed data communication is available in general households, an Internet connection environment by a communication system such as ADSL (Asymmetric Digital Subscriber Line) system using public telephone lines and by a cable connection system using a communication line of a cable television network has become widespread.

In the cable connection system, a mainline network and branch lines to households were conventionally realized by coaxial cables. However, the tendency has been toward an increase in use of data communication such as Internet connection as previously described. On this account, in the case of a best-effort connection system, there is a the problem that a heavy traffic causes a significant drop of a communication speed for each user.

In order to increase the capacity of data communication in a cable network, the introduction of the HFC (Hybrid Fiber/Coaxial) system using optical fibers for the part of a mainline network has been developed. This makes it possible to provide users with broadband data communication services of several Mbit/sec even at heavy traffic hours.

For example, even in the case of using 64QAM (Quadrature Amplitude Modulation), which is no longer state-of-art technology, as a modulation system of data communication used in the cable network, it is possible to carry out high-speed data communication with a bandwidth of 6 MHz and a transmission rate of 30 Mbit/sec. In fact, using an unassigned channel of a cable television, a transmission rate of 4 Mbit/sec to 27 Mbit/sec has been realized to use in transmitting/receiving digital signals over a cable network as a high-speed analog communication network in such a manner like a cable modem.

Hereinafter, a conventional tuner of a cable modem will be described with reference to a block diagram shown in FIG. 8. The cable modem is composed of a tuner, a digital signal processing circuit, and other components, and FIG. 8 illustrates a schematic structure of the tuner.

The tuner for use in a cable modem includes, for example, a receiver circuit for a UHF band (B3 band) covering 470 MHz to 860 MHz, a receiver circuit for a VHF High band (B2 band) covering 170 MHz to 470 MHz, and a receiver circuit for a VHF Low band (B1 band) covering 54 MHz to 170 MHz.

The cable line is connected to the input terminal 101, and CATV signals are transmitted and received via the input terminal 101. The CATV signals are composed of upstream signals transmitted from the cable modem to the cable line and downstream signals transmitted from the cable line to the cable modem. The upstream signals consist of signals in the range from 5 MHz to 42 MHz frequencies, and the downstream signals consist of signals in the range from 54 MHz to 860 MHz frequencies.

The upstream signals are transmitted as data signals subjected to QPSK (Quadrature phase shift keying) from a QPSK transmitter in the digital signal processing circuit and supplied to a data terminal 141. The data signals supplied to the data terminal 141 are transmitted via an LPF (Low Pass Filter) 140 as an upstream circuit from the input terminal 101 to the cable line.

Meanwhile, the downstream signals are supplied from the input terminal 101 and pass through a HPF (High Pass Filter) 102 as an IF (Intermediate Frequency) filter. Thereafter, the downstream signals are supplied to input switching circuits 103, 104, and 105. They are subjected to the respective processing in the UHF band receiver circuit, the VHF High band receiver circuit, and the VHF Low band receiver circuit. The above HPF 102 is a high pass filter having 5 MHz to 46 MHz as an attenuation band and 54 MHz or higher as a passing band. Each of the receiver circuits activates in accordance with receivable channels and does not operate for channels other than the receivable channels.

Next, the following will describe operations of the receiving bands. After passing through the signal switching circuits 103, 104, and 105, the CATV signals enter high frequency amplifying input circuits 106, 107, and 108. Then, the CATV signals are amplified in the high frequency amplifiers 109, 110, and 111, and reception signals are delivered from the high frequency amplification/output tuning circuits 112, 113, and 114. Thereafter, the reception signals are subjected to frequency conversion by mixer circuits 115, 116, and 117 and local oscillator circuits 118, 119, and 120. As described above, after signal processing in the receiver circuits, the respective output signals from the receiver circuits are IF-amplified in an intermediate frequency amplification circuit 121. Thereafter, the resultant signals are outputted from an IF output terminal 122.

The cable modem is constituted by the above-arranged tuner and a signal processing section including a QAM demodulation circuit for demodulating a signal received by the tuner. As shown in FIG. 8, the tuner is basically composed of analog circuits, while the A/D converter and the subsequent circuits in the signal processing section are composed of digital circuits. Therefore, in many cases, the tuner and the signal processing section are designed by analog circuit engineers and digital circuit engineers, respectively.

Here, the upstream signals must be amplified to a predetermined voltage to output it to the cable line. Conventionally, a return path amplification circuit for amplifying the upstream signals was provided on the signal processing section. In this case, the return path amplification circuit composed of analog circuits was designed by digital circuit engineers. However, performance in the tuner is strictly stipulated by various specifications. It is difficult for digital circuit engineers to design the return path amplification circuit so as to meet the requirements. This caused an extreme increase in time and cost.

Note that, for example, Japanese Laid-Open Patent Publication No. 14058/1993 (Tokukaihei 5-14058; published on Jan. 22, 1993) discloses a technique for improving performance of a mixer circuit in a tuner.

SUMMARY OF THE INVENTION

The present invention is attained to solve the above problem, and an object of the present invention is to provide a tuner for use in a cable modem and a cable modem which reduce development costs and development time for the tuner and realizes downsizing of the cable modem itself and improvement in transmission characteristic.

In order to solve the above problem, a tuner for use in a cable modem according to the present invention, includes:

a reception processing section for receiving a signal transmitted from a communication line; and a return path circuit for transmitting to the communication line a signal transmitted from a signal processing section, the cable modem including the tuner for transmitting and receiving an analog signal to and from the communication line and the signal processing section for performing modulation and demodulation with respect to a signal transmitted and received by the tuner, the return path circuit including a return path amplification circuit for performing power amplification of a signal transmitted from the signal processing section.

As described above, the cable modem is constituted by the tuner and the signal processing section. The tuner is basically composed of analog circuits, while the signal processing section is basically composed of digital circuits. Therefore, the tuner and the signal processing section are developed and designed by analog circuit engineers and digital circuit engineers, respectively.

Conventionally, the return path amplification circuit was provided on the signal processing circuit. Because of this, the return path amplification circuit composed of analog circuits was designed by digital circuit engineers. However, the difficulty for the digital circuit engineers in designing the return path amplification circuit caused an extreme increase in time and cost.

On the contrary, in the arrangement of the present embodiment, the return path amplification circuit is incorporated in the tuner. This allows analog circuit engineers to design the return path amplification circuit, resulting in a drastic reduction in development costs and development time.

Further, in addition to the above economic advantage, it is possible to downsize a cable modem itself and to improve transmission characteristic (amplitude characteristic and phase characteristic).

More specifically, as described above, the return path amplification circuit was conventionally disposed outside the tuner (on the signal processing section of a cable modem). On the contrary, the return path amplification circuit is incorporated in the tuner in the above arrangement. Therefore, in the case where the tuner is equal in size to the conventional one, it is possible to downsize a cable modem by a circuit area of the return path amplification circuit.

Moreover, the return path amplification circuit was conventionally disposed outside the tuner. This increased the wiring length from a transmission section of the upstream signals to the tuner, which caused deterioration in transmission characteristic. On the contrary, in the above arrangement, the return path amplification circuit is incorporated in the tuner. This decreases the wiring length, resulting in improvement in transmission characteristic (including spurious mixing in a system clock and others).

Further, a cable modem according to the present invention includes:

a tuner for transmitting and receiving an analog signal to and from a communication line; and a signal processing section for performing modulation and demodulation of transmitted and received signals to and from the tuner, the tuner including:

a reception processing section for receiving a signal transmitted from the communication line; and a return path circuit for transmitting to the communication line a signal transmitted from the signal processing section, the return path circuit including a return path amplification circuit for performing power amplification of a signal transmitted from the signal processing section.

According to the above arrangement, it is possible to provide a cable modem of small size and excellent transmission characteristic.

For a fuller understanding of the nature and advantages of the invention, reference should be made to the ensuing detailed description taken in conjunction with the accompanying drawings.

DESCRIPTION OF THE INVENTION

Referring to drawings, the following will explain one embodiment of the present invention.

(Overall Structure of a Cable Modem)

Figure 2:
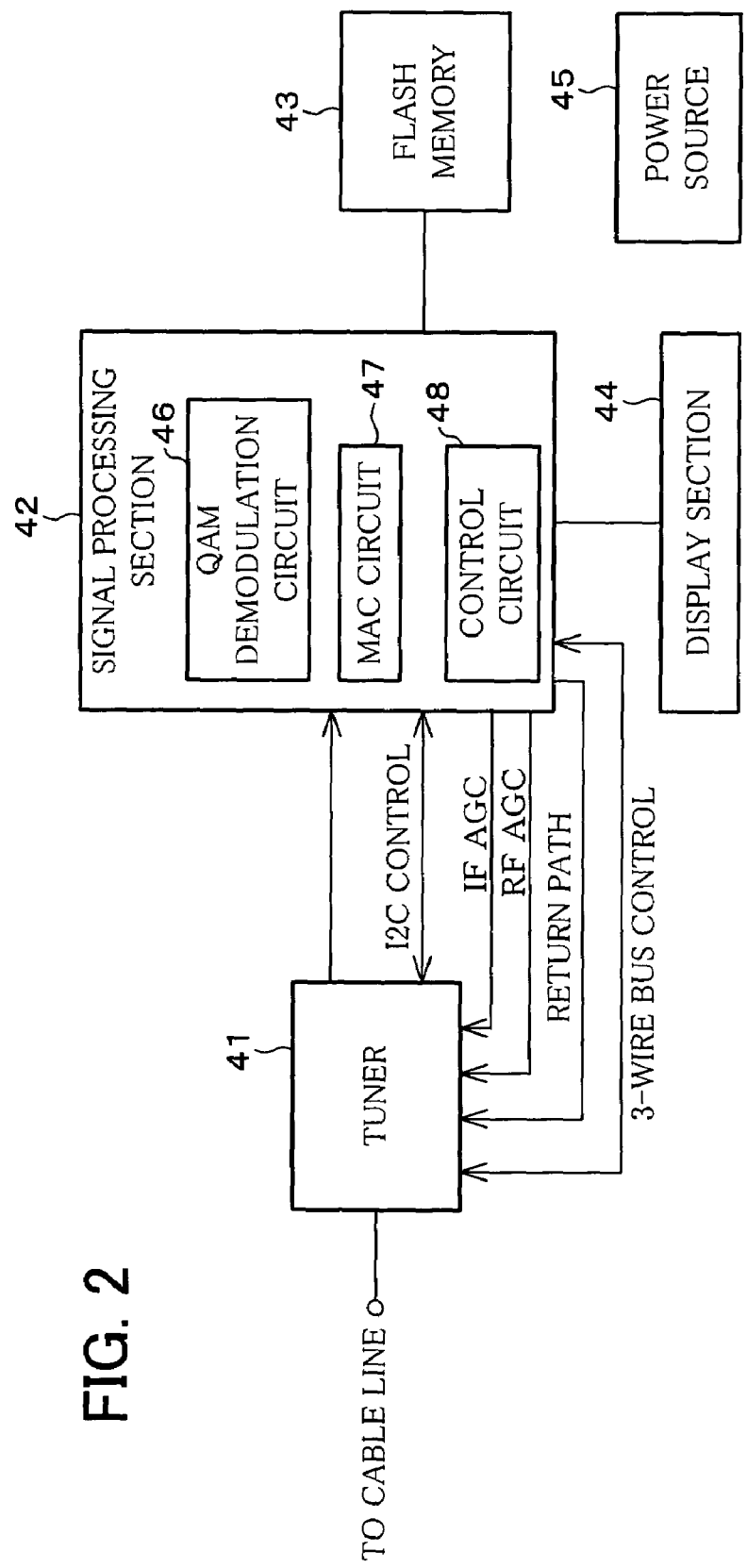
FIG. 2 is a block diagram showing a schematic structure of the cable modem

The description of the present embodiment is given based on a cable modem for use in carrying out data communication such as Internet connection, using a communication line of a cable television network. FIG. 2 is a block diagram showing a schematic structure of a cable modem according to the present embodiment. As shown in FIG. 2, the cable modem includes a tuner 41, a signal processing section 42, a flash memory 43, a display section 44, and a power source 45.

The tuner 41 performs a reception processing for receiving incoming signals from a cable line which constitutes a communication network of a cable television network, and a transmission processing for outputting signals outputted from the signal processing section 42 to the cable line. The tuner 41 performs the reception processing in accordance with a single conversion system which is a super heterodyne system for converting a frequency of an input signal into an intermediate frequency. The details of the tuner 41 will be described later.

The signal processing section 42 includes a QAM demodulation circuit 46, a MAC circuit 47, and a control circuit (data processing circuit) 48. The QAM demodulation circuit 46 is a circuit that carries out QAM demodulation of signals outputted from the tuner 41. The QAM demodulation circuit 46 also performs I²C bus communication control operation and IF AGC and RF AGC control operations for the tuner 41. The MAC circuit 47 is a circuit that performs a processing of a MAC (Media Access Control) layer protocol. The control circuit 48, which is a circuit that controls a whole processing in the signal processing section 42, is realized by a CPU (Central Processing Unit), for example. Further, the control circuit 48 includes a QPSK transmitter which transmits to the tuner 41 signals to be outputted from the signal processing section 42 toward the cable line as well as controls a digital control signal via 3-Wire Bus format to transmit it to the tuner 41. The signal processing section 42 is essentially built on a board where a digital signal processing circuit such as LSI is provided.

Further, the signal processing section 42 has an interface, not shown, for use in connection to an external device, e.g. personal computer. This interface allows the external device to transmit/receive data via the cable line. Examples of the interface include USB interface and LAN interface.

The flash memory 43 is a nonvolatile storage means that stores therein a program and the like used when the control circuit 48 in the signal processing section 42 carries out control operation. The display section 44 displays a state of operation in the cable modem. The display section 44 is realized by an LED lamp and an LCD, for example. The power source 45 supplies power to components inside the cable modem.

(Structure of the Tuner)

Figure 1:
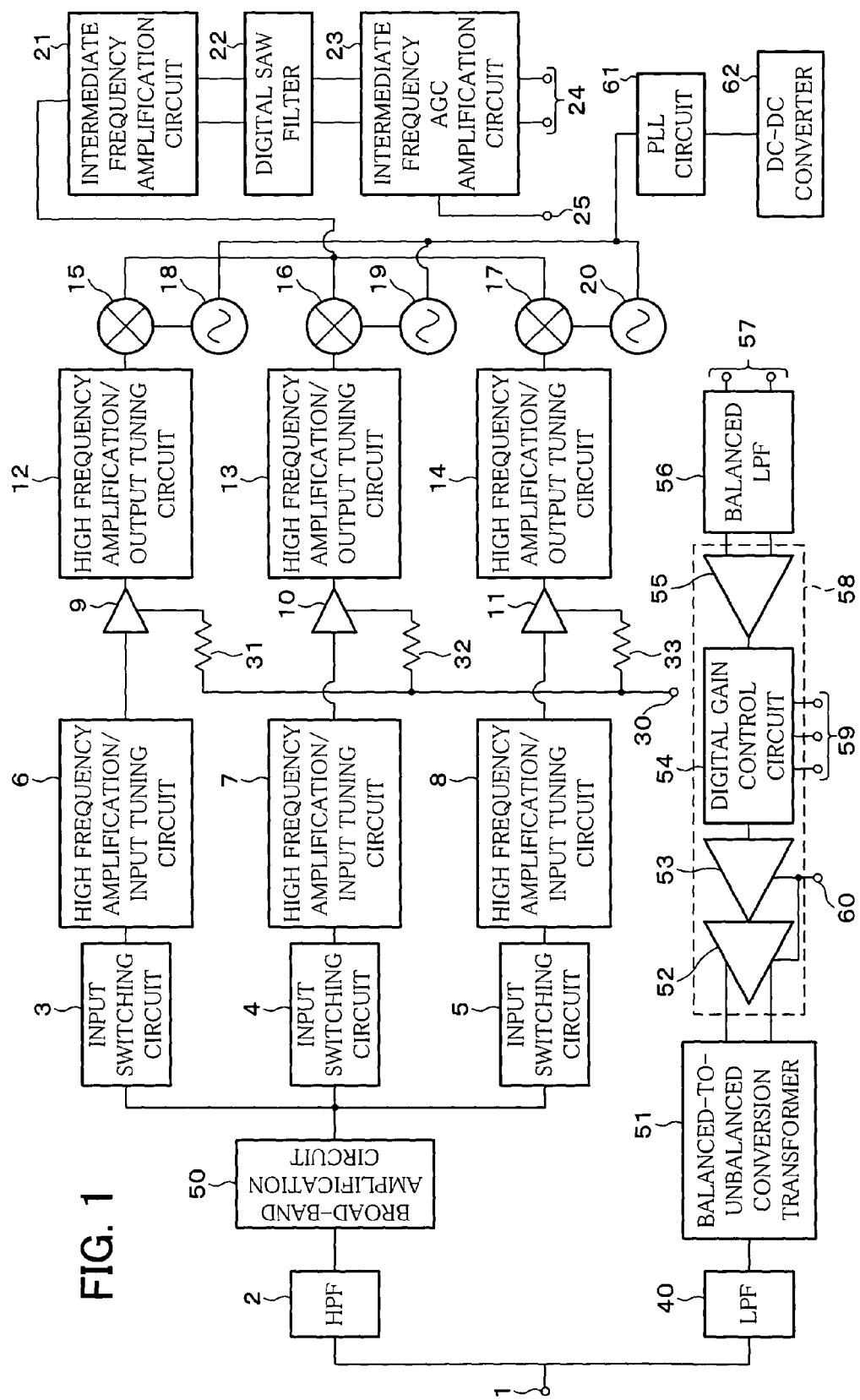
FIG. 1 is a block diagram showing a schematic structure of a tuner included in a cable modem according to one embodiment of the present invention.

The following will describe a structure of the tuner 41. FIG. 1 is a block diagram showing a schematic structure of the tuner 41. The tuner 41 is broadly composed of a reception processing section and a return path circuit. As described previously, CATV signals are composed of upstream signals transmitted from the cable modem to the cable line and downstream signals transmitted from the cable line to the cable modem. The upstream signals and downstream signals consist of signals in the range from 5 MHz to 42 MHz frequencies and signals in the range from 54 MHz to 860 MHz frequencies, respectively. The reception processing section performs a reception processing of the downstream signals, and the return path circuit performs a transmission processing of the upstream signals.

Components of the reception processing section are classified by function into an input processing section, a high frequency processing section, and an intermediate frequency processing section. The input processing section is composed of a HPF (High Pass Filter) 2 and a broad-band amplification circuit 50. The HPF 2 picks up a signal having a frequency band of the downstream signal from QAM signals supplied from the cable line via the input/output terminal 1. The broad-band amplification circuit 50 is a circuit which amplifies a signal passing through the HPF 2 by a few decibels.

The high frequency processing section classifies high frequency signals outputted from the input processing section into three kinds signals of the respective frequency bands, and performs processing including amplification and frequency conversion for the respective signals of the frequency bands. Examples of the frequency band include the following three frequency bands: a UHF band (B3 band) covering 470 MHz to 860 MHz, a VHF High band (B2 band) covering 170 MHz to 470 MHz, and a VHF Low band (B1 band) covering 54 MHz to 170 MHz. The high frequency processing section is provided with the circuits for processing the respective signals of the frequency bands.

More specifically, the high frequency processing section includes: input switching circuits 3, 4, and 5; high frequency amplification/input tuning circuits 6, 7, and 8; high frequency amplifiers 9, 10, and 11; high frequency amplification/output tuning circuits 12, 13, and 14; mixer circuits 15, 16, and 17; local oscillator circuits 18, 19, and 20; a DC-DC converter 62; and a PLL circuit 61.

The input switching circuit 3, 4, and 5 classifies the signals outputted from the broad-band amplification circuit 50 into the respective signals of the frequency bands. That is, any one of the input switching circuits 3, 4, and 5 becomes active in accordance with the frequency band of an incoming signal, and only the active input switching circuit and the subsequent circuits perform a high frequency signal processing.

The signals outputted from the input switching circuit 3, 4, and 5 are amplified respectively by the high frequency amplification/input tuning circuits 6, 7, and 8, the high frequency amplifiers 9, 10, and 11, and the high frequency amplification/output tuning circuits 12, 13, and 14. At this moment, to the high frequency amplifiers 9, 10, and 11, RF AGC signals transmitted from the QAM demodulation circuit 46 are supplied via AGC resistors 31, 32, and 33, respectively. The high frequency amplifiers 9, 10, and 11 perform amplification in accordance with the RF AGC signals.

Thereafter, the amplified signals are subjected to frequency conversion by the mixer circuits 15, 16, and 17 and the local oscillator circuits 18, 19, and 20. The mixer circuits 15, 16, and 17 mix local oscillator signals of frequencies in accordance with the corresponding channel with the amplified QAM signals to perform frequency conversion into intermediate frequency signals. The local oscillator circuits 18, 19, and 20 generate the foregoing local oscillator signals. The local oscillator circuits 18, 19, and 20 are adapted to adjust frequencies of signals that will be generated under the control of the PLL circuit 61. The PLL circuit 61 is powered from the DC-DC converter 62 as a tuning power supply circuit.

The intermediate frequency processing section includes an intermediate frequency amplification circuit 21, a digital SAW filter 22, and an intermediate frequency AGC amplification circuit 23. The intermediate frequency amplification circuit 21 amplifies the intermediate frequency signals outputted from the high frequency processing section. The digital SAW filter 22 serves as a narrow-band pass filter and removes out-of-band signals from the intermediate frequency signals outputted from the intermediate frequency amplification circuit 21.

The intermediate frequency AGC amplification circuit 23 amplifies the intermediate frequency signals outputted from the digital SAW filter 22 and outputs the signals thus amplified from output terminals 24 toward the QAM demodulation circuit 46. To the intermediate frequency AGC amplification circuit 23, IF AGC signals transmitted from the QAM demodulation circuit 46 are supplied via an AGC signal input terminal 25. The intermediate frequency AGC amplification circuit 23 performs the operation of amplification in accordance with this IF AGC signal.

On the other hand, the return path circuit includes an LPF (Low Pass Filter) 40, a balanced-to-unbalanced conversion transformer 51, a return path amplification circuit 58, and a balanced LPF 56. The upstream signals are outputted as QPSK signals from the control circuit 48 in the signal processing section 42 and are supplied from input terminals 57.

The balanced LPF 56 filters the QPSK signals supplied from the data signal input terminal 57 to remove an n-order higher harmonics. The return path amplification circuit 58, which performs power amplification of approximately 30 dB to the signal outputted from the balanced LPF 56, includes a preamplifier 55, a digital gain control circuit 54, and power amplification circuits 52 and 53.

To the digital gain control circuit 54, control signals of 3-Wire Bus format are supplied via the digital gain control terminals 59 from the control circuit 48 in the signal processing section 42. In accordance with the control signals, the digital gain control circuit 54 is adapted to perform output control of output signals in 1 db or 0.5 dB steps in the range from +58 dBmV to +5 dBmV of output level.

The power amplification circuits 52 and 53 perform a processing for amplifying output level of the output signals under the control of the digital gain control circuit 54. Further, the power amplification circuits 52 and 53, which are connected to a return path signal control terminal 60, cuts off a data signal not to be sent out in accordance with the control signal supplied from the return path signal control terminal 60. This control signals are transmitted from the control circuit 48 of the signal processing section 42.

The balanced-to-unbalanced conversion transformer 51 performs impedance conversion of return path signals outputted from the return path amplification circuit 58. The LPF (Low Pass Filter) 40 performs a processing for removing out-of-band signals from signals outputted from the balanced-to-unbalanced conversion transformer 51, and the resultant output signal are outputted via the input/output terminal 1 to the cable line.

(Incorporation of the Return Path Amplification Circuit)

As described above, in the present embodiment, the tuner 41 has an arrangement in which the return path amplification circuit 58 is provided in the return path circuit. This arrangement brings about the following effects.

Conventionally, the return path amplification circuit was provided on a board where a digital signal processing circuit is provided. Because of this, the return path amplification circuit composed of analog circuits was designed by digital circuit engineers. In this case, the difficulty for the digital circuit engineers in designing the return path amplification circuit caused an extreme increase in time and cost.

On the contrary, in the arrangement of the present embodiment, the return path amplification circuit 58 is incorporated in the tuner 41. This allows analog circuit engineers to design the return path amplification circuit 58, resulting in a drastic reduction in development costs and development time.

Further, the return path amplification circuit 58 was conventionally disposed outside the tuner 41 (on a board of a cable modem), while the return path amplification circuit 58 is incorporated in the tuner 41 in the arrangement of the present embodiment. Therefore, in the case where the tuner 41 is equal in size to the conventional one, it is possible to downsize a cable modem by a circuit area of the return path amplification circuit 58.

Moreover, the return path amplification circuit 58 was conventionally disposed outside the tuner 41. This increased the wiring length from a transmission section of the upstream signals to the tuner 41, which caused deterioration in transmission characteristic. On the contrary, in the arrangement of the present embodiment, the return path amplification circuit 58 is incorporated in the tuner 41. This decreases the wiring length, resulting in improvement in transmission characteristic (including spurious mixing in a system clock and others).

(Incorporation of an IF AGC Amplification Circuit)

As described above, the intermediate frequency processing section includes the intermediate frequency amplification circuit 21, the digital SAW filter 22, and the intermediate frequency AGC amplification circuit 23. That is, these members are incorporated in the tuner 41.

Figure 8:
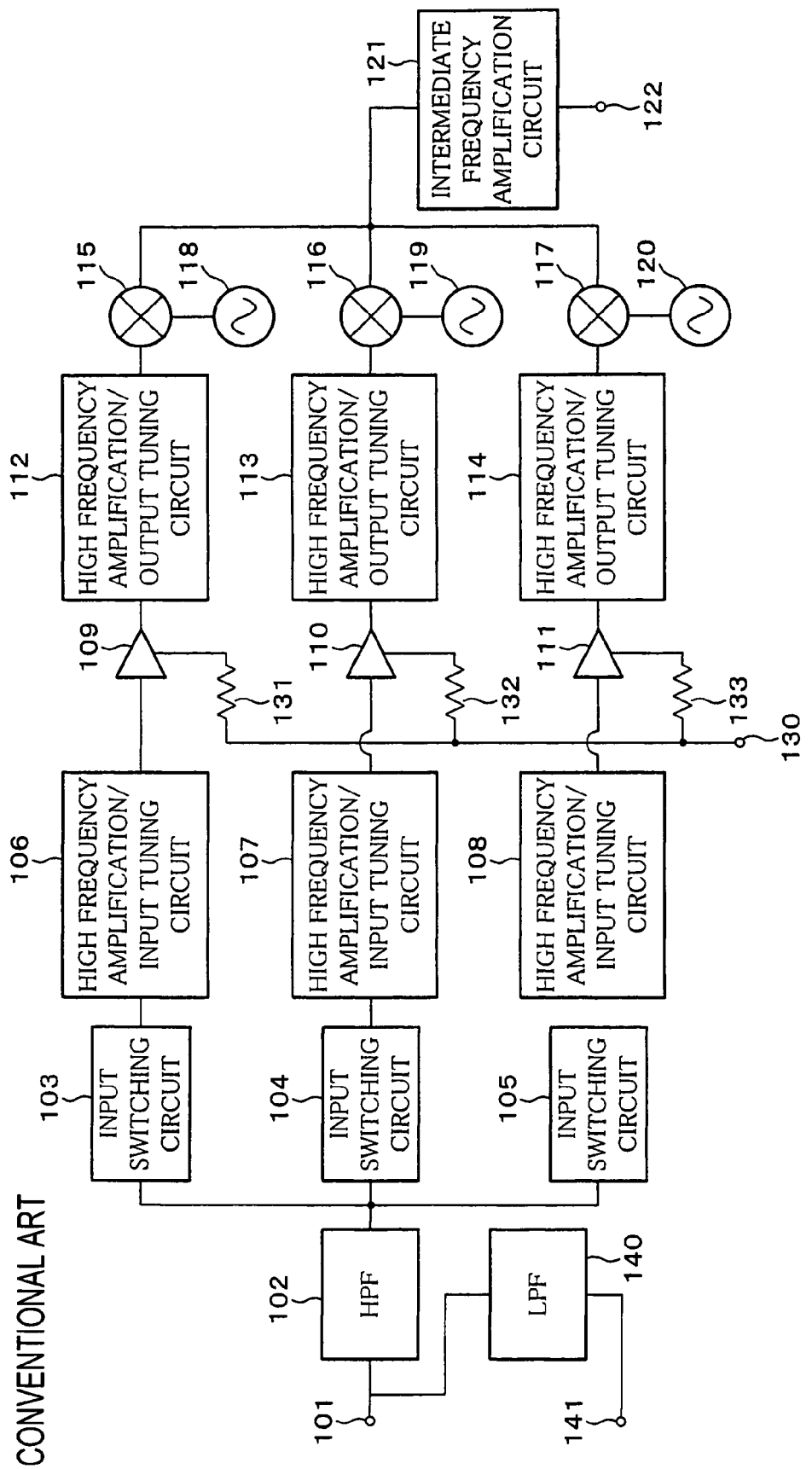
FIG. 8 is a block diagram showing a schematic structure of a tuner included in a conventional cable modem.

An intermediate frequency processing section provided in a conventional tuner, as shown in FIG. 8, was only provided with an intermediate frequency amplification circuit 121. The digital SAW filter and the intermediate frequency AGC amplification circuit were provided not on a tuner, but on a board where the signal processing section is provided.

In developing a cable modem, a tuner section, which is almost composed of analog circuits, is often designed by analog circuit engineers. The signal processing section, which is almost composed of digital circuits, is often designed by digital circuit engineers.

In this case, in the case where the digital SAW filter and the intermediate frequency AGC amplification circuit are provided on a board where the signal processing section is provided, which is a digital circuit, a design of these components is performed by digital circuit engineers. However, tuning of these components requires knowledge of an analog circuit. Because of this, it was extremely difficult for digital circuit engineers to extract most suitable MSE (SNR (Signal to Noise Ratio)) and BER (Bit Error Rate). Further, whether performance quality of a downstream signal meets requirements of DOCSIS (Data-Over-Cable Service Interface Specification) PHY17H must be judged collaboratively by analog circuit engineers and digital circuit engineers, which was time-consuming.

On the other hand, in the present embodiment, as described above, the digital SAW filter 22 and the intermediate frequency AGC amplification circuit 23 are provided in the tuner 41. This allows analog circuit engineers to design these components. This makes it possible to drastically reduce a time of tuning for the getting the best performance and a time for the evaluation on DOCSIS.

(Reduction of Distortion Characteristic in the Return Path Circuit)

To the return path circuit, a system clock of approximately 20 MHz to 30 MHz as well as the upstream signal are inputted from the data signal input terminal 57. Therefore, combination of these two signals causes a signal distortion, resulting in spurious emission.

On the other hand, DOCSIS PHY17H provides requirements on a reliable performance quality of the downstream signal. Specifically, PHY17H provides requirements of BER (Bit Error Rate) performance in a receiving signal by QAM and requirements of the degree of influence by an interference signal. According to this DOCSIS PHY17H, spurious emission in a reception band (out of band) of the downstream signals is specified to be −50 dBmV or lower.

In order to reduce spurious emission in this reception band, in the present embodiment, as described above, the balanced LPF 56 is inserted between the data signal input terminal 57 and the return path amplification circuit 58. In the present embodiment, the cutoff frequency of the balanced LPF 56 is set to 50 MHz. This makes it possible to suppress spurious emission in the reception band and to meet the requirements of DOCSIS PHY17H.

Note that, since an input circuit to ICs that make up the return path amplification circuit 58 is generally balanced input, a balanced LPF is inserted in the present embodiment. However, an LPF is not limited to the balanced LPF, and a usual unbalanced LPF may be adopted for an LPF. The balanced LPF has the advantage of being less subject to unbalanced noise and the disadvantage of circuit components increased in number, in comparison with the unbalanced LPF.

In addition, the DOCSIS PHY17H provides a requirement that a QPSK signal and a 16QAM signal should be outputted to the return path amplification circuit at the output levels of +58 dBmV or higher and +55 dBmV or higher, respectively, and a requirement that a relative ratio of harmonic distortion at the aforementioned output levels should be −47 dBc or higher.

Figure 3:
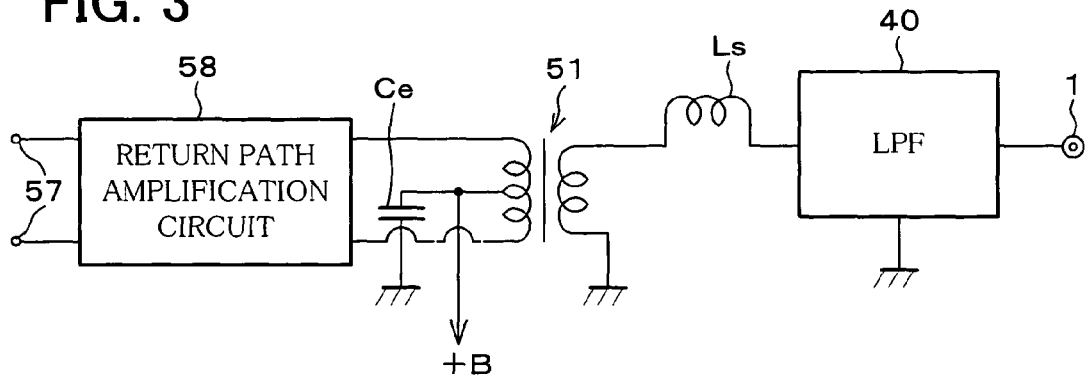
FIG. 3 is a circuit diagram showing a configuration of a return path circuit included in the tuner.

In the present embodiment, the return path circuit has a configuration as shown in FIG. 3 so as to reduce harmonic distortion in the return path amplification circuit. Note that, the balanced LPF 56 is omitted in FIG. 3. As shown in FIG. 3, the balanced-to-unbalanced conversion transformer 51 provides a midpoint installation capacitor Ce connected at a midpoint of the inductor, making up a balun transformer. Between the balanced-to-unbalanced conversion transformer 51 and the LPF 40 provided is a matching inductor Ls. In in-band (5 MHz to 42 MHz), output impedance of the balanced-to-unbalanced conversion transformer 51 as a balun transformer fluctuates. However, insertion of the matching inductor Ls suppresses in-band spurious distortion. This is because the insertion of the matching inductor Ls causes mismatch loss, improving a distortion rate of the return path amplification circuit 58.

(DC-DC Converter)

Figure 4:
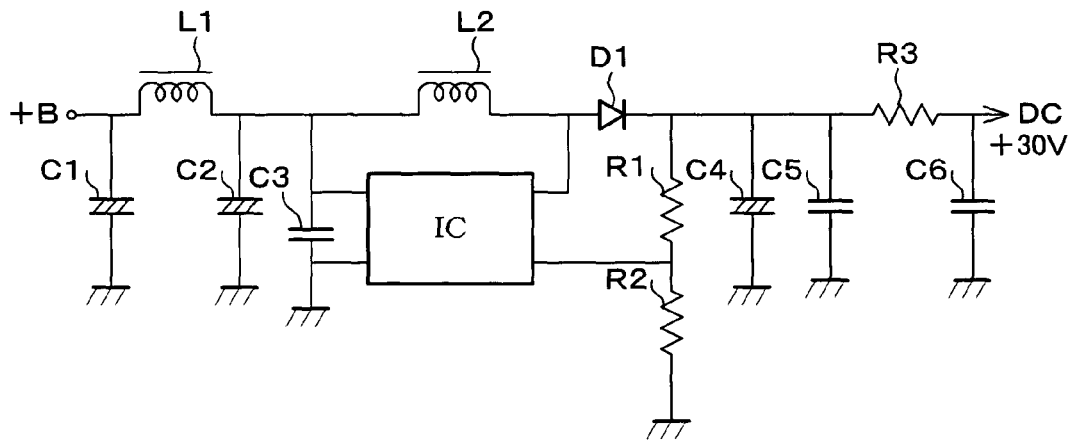
FIG. 4 is a circuit diagram showing a configuration of a DC-DC converter included in the tuner.

The following description will be given based on the DC-DC converter 62. The DC-DC converter 62, a tuning power supply circuit for the PLL circuit 61, usually requires a voltage of 30V to 33V. FIG. 4 is a circuit diagram showing a configuration of the DC-DC converter 62. As shown in FIG. 4, the DC-DC converter 62 includes: a step-up converter (regulator) indicated by IC; inductors indicated by L1 and L2; smoothing electrolytic capacitors indicated by C1, C2, and C4; high-frequency bypass capacitors indicated by C3, C5, and C6; output voltage setting bias resistors indicated by R1 and R2; and a resistor indicated by R3. Note that, from a terminal indicated by +B in FIG. 4, a power supplied from the power source 45 is inputted. The power supplied here is a power source from 5V line that is the voltage of a power supply for a tuner. Further, DC30V is outputted to the PLL circuit 61.

The inductor L1 and the electrolytic capacitors C1 and C2 constitute a line filter for reducing spurious flowing into from +B line. The inductor L2 serves as a line-up inductor. Further, the resistor R3 and the capacitors C5 and C6 constitute an output noise filter for reducing a low-frequency noise contained in the power outputted to the PLL circuit 61.

Although there are various forms of converters as a regulator, a boost converter of the PWM (Pulse Width Modulation) control mode is adopted in the present embodiment to boost a voltage of 5V supplied from a power source to a voltage of 30V to 33V. Note that, a charge-pump converter may be adopted for a regulator. As compared to the charge-pump converter, the boost converter has advantages of small occupied area in a circuit and high versatility, but it has a disadvantage of a poor characteristic with respect to spurious noise and phase noise. As to a tuner regulator, a demand for low noise is growing, but demands for efficiency and output volume is small. Viewed in this light, the charge-pump converter is ideal. However, the boost converter is adopted in the present embodiment to give priority to versatility and downsizing. That is, in the present embodiment, the boost converter is used on the ground of versatility and downsizing, and the provision of an output noise filter allows for noise characteristic that is a drawback of the boost converter.

(Layout of a Chassis in the Tuner)

Figure 5:
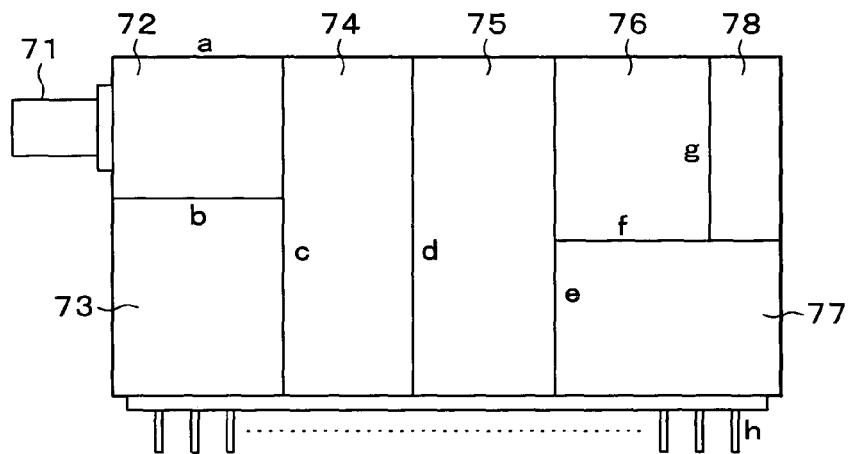
FIG. 5 is a cross-sectional diagram showing a layout in a chassis of the tuner.

Next, the following description will be given based on a layout of a chassis in the tuner 41. FIG. 5 is a cross-sectional diagram showing a layout of a chassis in the tuner 41. The tuner 41 is constituted by a cabinet made from a 0.6-mm-thick steel plate folded in a box form, in which circuits as components are disposed.

In FIG. 5, there is shown an input/output terminal 71 realized by an F-type plug. The input/output terminal 71 is equivalent to the input/output terminal 1 shown in FIG. 1. In a region 72 disposed are diplexer circuits. These diplexer circuits are equivalent to the HPF 2 and LPF 40 shown in FIG. 1. In the region 73 disposed is a return path circuit.

In a region 74 disposed are the broad-band amplification circuit 50, the input switching circuits 3, 4, and 5, and the high frequency amplification/input tuning circuits 6, 7, and 8. In a region 75 disposed are the high frequency amplifiers 9, 10, and 11, the AGC resistors 31, 32, and 33, and the high frequency amplification/output tuning circuits 12, 13, and 14. In a region 76 disposed are the mixer circuits 15, 16, and 17, the local oscillator circuits 18, 19, and 20, and the PLL circuit 61. In a region 77 disposed are the intermediate frequency amplification circuit 21, the digital SAW filter 22, and the intermediate frequency AGC amplification circuit 23. In a region 78 disposed is the DC-DC converter 62.

The circuits in the above regions are provided on one surface of a board with partition members on the boundaries (indicated by a to g in FIG. 5) of the regions. The partition member is made from SPTC (tinned steel plate), having an electrical and electromagnetic shielding effect. This makes it possible to prevent electrical and electromagnetic noise from affecting some other regions.

Further, at the bottom of the chassis shown in FIG. 5, terminals indicated by h are provided. These terminals are connected to the board making up the signal processing section 42 shown in FIG. 2. Namely, the tuner 41 and the signal processing section 42 are hard-wired via the terminals h.

The description begins with a single-sided board system adopted in the present embodiment. The conventional tuner adopted a double-sided board system in which the circuits as components are provided on both surfaces of the board. This is because the double-sided board system is advantageous in distortion characteristic over the single-sided board system in which the circuits are provided on one surface of the board.

Note that, it is preferable for the distortion characteristic that a ground pattern is at a low potential, and in the case of the double-sided board system, it is possible to design a ground pattern at a low potential. Therefore, the double-sided board system is advantageous in distortion characteristic. For example, in the case of the double-sided board, when there are two earths with respect to the board, the length of earth wires in each of the circuits can be relatively shortened via through holes provided to the board. On the other hand, in the case of single-sided board, it is necessary to rout the earth wires on a plane surface. That is, the double-sided board can shorten the length of earth wires and reduce distortion caused by noise that the earth wires pick up, as compared to the single-sided board.

However, as compared to the single-sided board system, the double-sided board system has the disadvantage of high processing cost in providing the circuits on the board because the circuits are provided on both surfaces of the board. In addition, the double-sided board system needs to use a board enabling the circuits to be provided on its both surfaces, increasing the cost of a board itself.

Figure 7:
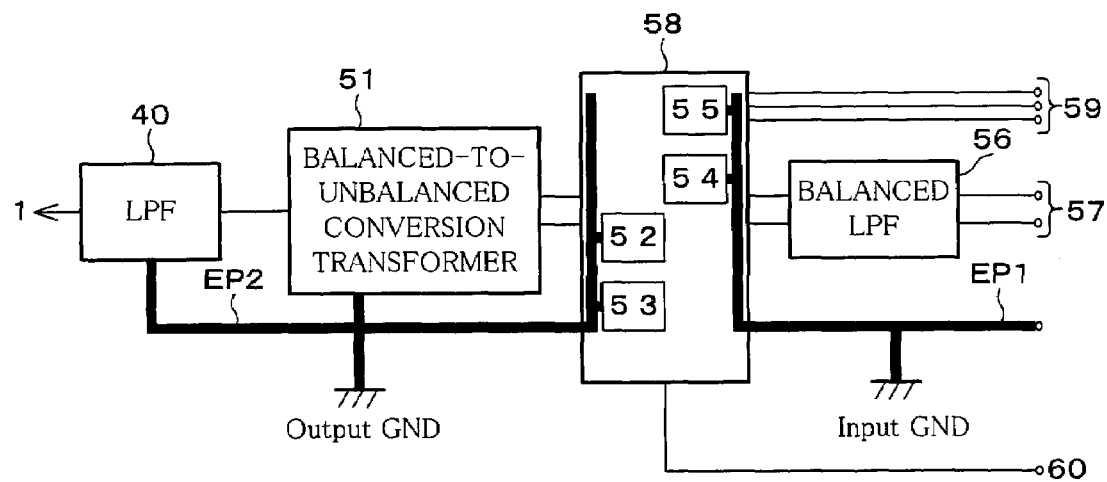
FIG. 7 is a block diagram showing an earth pattern around connection sections of an LPF, a balanced-to-unbalanced conversion transformer, a return path amplification circuit, and a balanced LPF.

In view of this, the tuner of the present embodiment adopts the single-sided board system as well as has an arrangement in which the distortion characteristic, which is a problem in the single-sided board system, is reduced to the same level of distortion characteristic as the double-sided board system. Specifically, an earth pattern of earth wires in the power amplification circuits 52 and 53 of the return path circuit are designed so as not to cross earth wires of the preamplifier 55. FIG. 7 is a diagram showing an earth pattern around connection sections of the LPF 40, the balanced-to-unbalanced conversion transformer 51, the return path amplification circuit 58, and the balanced LPF 56. As shown in FIG. 7, to an earth pattern EP1 on the input side of the return path amplification circuit 58 connected are earths of the preamplifier 55 and the digital gain control circuit 54. To an earth patter EP2 on the output side of the return path amplification circuit 58 connected are earths of the power amplification circuits 52 and 53, the LPF 40, and the balanced-to-unbalanced conversion transformer 51.

Thus, the distortion characteristic in the single-sided board system can be reduced to the same level of the distortion characteristic as the double-sided board system, in such a manner to design an earth pattern so that earth wires in the power amplification circuits 52 and 53 in the return path circuit do not cross earth wires of the preamplifier 55. Further, as shown in FIG. 7, peripheral components to the return path amplification circuit 58 are disposed so that a signal flows in one direction. This allows the return path amplification circuit 58 to be isolated. Also, disposing the balanced-to-unbalanced conversion transformer 51 at the nearest position to ICs in the return path amplification circuit 58 and sharing an earth between the LPF 40 and the balanced-to-unbalanced conversion transformer 51 have the effect of improving the distortion characteristic.

Next, the following will describe the arrangement of the regions in the structure of the chassis shown in FIG. 5. In the present embodiment, as described above, the return path circuit including the return path amplification circuit 58 is provided in the tuner 41. In this case, the return path amplification circuit 58 has an output level of +10 dBm, which is a relatively high value. This causes the problem that interference occurs due to the influence on the peripheral circuits. For example, because of a large output of the return path amplification circuit 58, this output could directly enter the broad-band amplification circuit 50 without passing through the LPF 40. This can cause distortion in the downstream signal and the upstream signal.

With respect to such a problem, in the present embodiment, the partition member having electrical and electromagnetic shielding effect is provided around the region 73 in which the return path circuit is disposed as described above. This arrangement solves the problem caused by providing the return path amplification circuit 58 in the tuner 41.

Further, in the present embodiment, as described above, it is arranged such that the intermediate frequency amplification circuit 21, the digital SAW filter 22, and the intermediate frequency AGC amplification circuit 23 are incorporated in the tuner 41. In such an arrangement, spurious generated from the DC-DC converter 62 could be guided to the intermediate frequency amplification circuit 21 and the input/output terminal 1. Note that, an IC in the DC-DC converter 62 incorporates an oscillator of approximately 100 kHz, and the above spurious is caused by the influence of this oscillator.

With respect to such a problem, in the present embodiment, as described above, the partition member having electrical and electromagnetic shielding effect is provided around the region 78 in which the DC-DC converter 62 is disposed. This arrangement solves the problem caused by providing the intermediate frequency amplification circuit 21, the digital SAW filter 22, and the intermediate frequency AGC amplification circuit 23 together in the tuner 41.

Further, in the DC-DC converter 62, as shown in FIG. 4, the inductor L2 is provided. It is considered that a magnetic field generated from this inductor L2 could have an influence on inductors provided in the tuner 4, e.g. inductors provided inside the local oscillator circuits 18, 19, and 20. In addition, in the DC-DC converter 62, as shown in FIG. 4, the IC as a step-up converter is provided. It is considered that an earth current generated from the IC could flow into some other earth wires in the tuner 41, affecting adversely.

With respect to such a problem, in the present embodiment, as described above, the partition member having electrical and electromagnetic shielding effect is provided around the region 78 in which the DC-DC converter 62 is disposed. This arrangement solves the problem caused by providing the DC-DC converter 62 and the other circuits of the tuner 41 together in the tuner 41.

(Connection Between the Tuner and the Power Source)

Next, the following will describe the connection between the tuner 41 and the power source 45. As described above, the tuner 41 incorporates the return path amplification circuit 58.

Here, simultaneous performance of a power supply to the return path amplification circuit 58 and a power supply to the other circuits of the tuner 41 causes the following problems. The return path circuit adopts a stand-by system in which power is supplied to the return path amplification circuit 58 only when a data signal is transmitted. This system is adopted for the purpose of realizing power savings from carrying out a power supply only when needed. Here, a power supply to the return path amplification circuit 58 when a data signal is transmitted causes a momentary fluctuation of a current by 100 mA or more. This fluctuates a current for a power supply to the other circuits in the tuner 41, causing a ripple. This results in adverse effects on the operations of other circuits.

Figure 6:
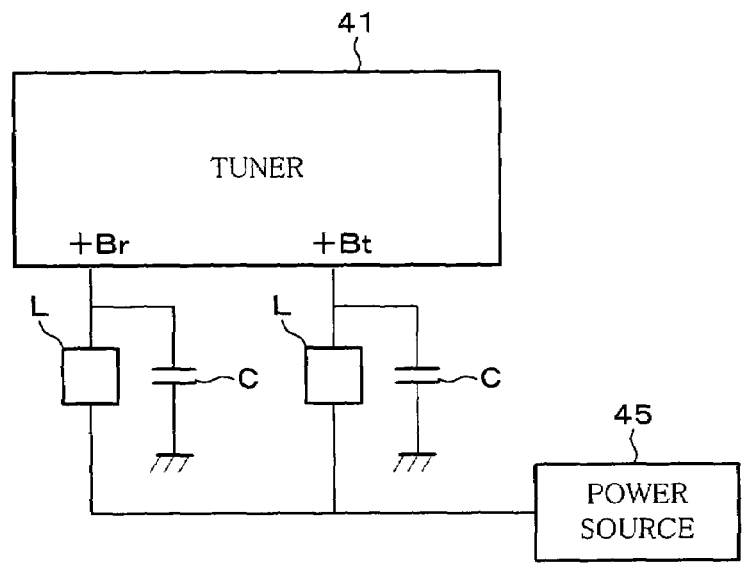
FIG. 6 is a circuit diagram showing a connection state of a decoupling circuit connected between a tuner and a power source.

In view of this, in the present embodiment, for realization of the suppression of a ripple caused by power supply to the return path amplification circuit 58, a decoupling circuit as shown in FIG. 6 is provided between the tuner 41 and the power source 45. In FIG. 6, +Br indicates a power supply to the return path amplification circuit 58, and +Bt indicates a power supply to the other circuits in the tuner 41. As shown in FIG. 6, a LPF constituted by a choking coil L of 100 μH or higher and an electrolytic capacitor of 100 μF or higher is respectively inserted in a power supply path to the return path amplification circuit 58 and a power supply path to the other circuits in the tuner 41. This arrangement can prevent the occurrence of a ripple in a power supply to the other circuits in the tuner 41 even when a large current is supplied momentarily to the return path amplification circuit 58.

As described above, a tuner for use in a cable modem, includes:

a reception processing section for receiving a signal transmitted from a communication line; and a return path circuit for transmitting to the communication line a signal transmitted from a signal processing section, the cable modem including the tuner for transmitting and receiving an analog signal to and from the communication line and the signal processing section for performing modulation and demodulation with respect to a signal transmitted and received by the tuner, the return path circuit including a return path amplification circuit for performing power amplification of a signal transmitted from the signal processing section.

As described above, the cable modem is constituted by the tuner and the signal processing section. The tuner is basically composed of analog circuits, while the signal processing section is basically composed of digital circuits. Therefore, the tuner and the signal processing section are developed and designed by analog circuit engineers and digital circuit engineers, respectively.

Conventionally, the return path amplification circuit was provided on the signal processing circuit. Because of this, the return path amplification circuit composed of analog circuits was designed by digital circuit engineers. However, the difficulty for the digital circuit engineers in designing the return path amplification circuit caused an extreme increase in time and cost.

On the contrary, in the arrangement of the present embodiment, the return path amplification circuit is incorporated in the tuner. This allows analog circuit engineers to design the return path amplification circuit, resulting in a drastic reduction in development costs and development time.

Further, in addition to the above economic advantage, it is possible to downsize a cable modem itself and to improve transmission characteristic (amplitude characteristic and phase characteristic).

More specifically, as described above, the return path amplification circuit was conventionally disposed outside the tuner (on the signal processing section of a cable modem). On the contrary, the return path amplification circuit is incorporated in the tuner in the above arrangement. Therefore, in the case where the tuner is equal in size to the conventional one, it is possible to downsize a cable modem by a circuit area of the return path amplification circuit.

Moreover, the return path amplification circuit was conventionally disposed outside the tuner. This increased the wiring length from a transmission section of the upstream signals to the tuner, which caused deterioration in transmission characteristic. On the contrary, in the above arrangement, the return path amplification circuit is incorporated in the tuner. This decreases the wiring length, resulting in improvement in transmission characteristic (including spurious mixing in a system clock and others).

Further, the tuner for use in a cable modem according to the present invention may have an arrangement in which the return path circuit is provided with a filter for removing noise included in a signal transmitted from the signal processing section.

In a signal transmitted from the signal processing section, a system clock of approximately 20 MHz to 30 MHz as well as a signal to be transmitted are included. Therefore, combination of these two signals causes a signal distortion, resulting in spurious emission. On the contrary, according to the above arrangement, the return path circuit is provided with the filter for removing noise included in a signal transmitted from the signal processing section, so that it is possible to reduce this spurious emission. Note that, since a frequency band of the spurious emission is usually away from that of the signal to be transmitted, removing noise with a filter is possible as described above.

Further, in the above arrangement, the tuner for use in a cable modem according to the present invention may have an arrangement in which power to the return path amplification circuit and power to components other than the return path amplification circuit in the tuner are supplied by separate routes.

For the realization of power saving, it is considered that the return path circuit adopts a stand-by system in which power is supplied to the return path amplification circuit only when a data signal is transmitted. In this case, a power supply to the return path amplification circuit causes a momentary much fluctuation of a current when a data signal is transmitted. This fluctuates a current for power supply to the remaining components other than the return path amplification circuit, causing a ripple. This results in adverse effects on the operations of the remaining components.

On the other hand, in the above arrangement, power to the return path amplification circuit and power to components other than the return path amplification circuit are supplied by separate routes. Therefore, it is possible to prevent the remaining components from being affected by the current fluctuation caused by the power supply to the return path amplification circuit during data transmission. Consequently, it is possible to realize operational stability of the remaining components other than the return path amplification circuit.

Further, in the above arrangement, the tuner for use in a cable modem according to the present invention may have an arrangement in which circuits constituting the reception processing section and the return path circuit are provided on one surface of a board.

In the tuner for use in a cable modem, as a system of providing the respective circuits of the components on a board, available are the double-sided board system in which the circuits are provided on both surfaces of a board and the single-sided board system in which the circuits are provided on one surface of a board. Conventionally, the double-sided board system was adopted because it has a high degree of flexibility in ground pattern, producing an excellent distortion characteristic. On the contrary, in the above arrangement, the single-sided board system is adopted. This makes it possible to reduce a processing cost in providing the circuits on the board and to reduce the cost of a board itself.

Further, in the above arrangement, the tuner for use in a cable modem according to the present invention may have an arrangement in which the return path circuit includes a balanced-to-unbalanced conversion transformer for converting a balanced output from the return path amplification circuit to an unbalanced output and a matching inductor which is provided on an output side of the balanced-to-unbalanced conversion transformer.

According to the above arrangement, the balanced-to-unbalanced conversion transformer converts the balanced output from the return path amplification circuit into an unbalanced output suitable for transmission to the communication line. Note that, this conversion causes noise in a frequency band of a transmission signal. Because of this, in the above arrangement, the matching inductor is provided on an output side of the balanced-to-unbalanced conversion transformer, realizing removal of the noise.

Further, in the above arrangement, the tuner for use in a cable modem according to the present invention may have an arrangement in which the return path circuit is surrounded by a partition member having electrical and electromagnetic shielding effect.

The return path amplification circuit has a relatively high value of output level. This causes the problem of interference with the peripheral circuits. This interference could cause distortion in the downstream signals and the upstream signals. Because of this, according to the above arrangement, the return path circuit including the return path amplification circuit is surrounded by a partition member having electrical and electromagnetic shielding effect. This arrangement can solve the above problem.

Further, the tuner for use in a cable modem according to the present invention may have an arrangement in which the reception processing section includes a PLL circuit used in performing frequency conversion and a DC-DC converter as a regulator for supplying power to the PLL circuit, and the DC-DC converter is surrounded by a partition member having electrical and electromagnetic shielding effect.

In the above arrangement provided is the DC-DC converter for supplying power to the PLL circuit used in performing frequency conversion. This makes it possible to supply power with a stable voltage to the PLL circuit, realizing operational stability of the PLL circuit. Consequently, it is possible to accurately perform frequency conversion in the reception processing section.

Meanwhile, the DC-DC converter incorporates an oscillator of approximately 100 kHz, and this generates spurious noise in output of the DC-DC converter. In addition, the DC-DC converter is provided with an inductor. It is considered that a magnetic field generated from this inductor could have an influence on various inductors provided in the tuner.

With respect to this, according to the above arrangement, the DC-DC converter is surrounded by the partition member having electrical and electromagnetic shielding effect. This arrangement can solve the above problem.

Further, in the above arrangement, the tuner for use in a cable modem according to the present invention may have an arrangement in which the reception processing section performs reception processing in accordance with a single conversion system for converting a frequency of a received signal into an intermediate frequency, and includes an intermediate frequency AGC amplification circuit for amplifying an intermediate frequency signal in accordance with an IF AGC signal transmitted from the signal processing section.

Conventionally, the intermediate frequency AGC amplification circuit for amplifying an intermediate frequency signal in accordance with IF AGC signal was provided on a board where the signal processing section is provided. Thus, in the case where the intermediate frequency AGC amplification circuit is provided on a board on a digital circuit side, designing of these components is performed by digital circuit engineers. However, tuning of these components requires knowledge of an analog circuit. Especially, it is extremely difficult for digital circuit engineers to extract most suitable MSE (SNR (Signal to Noise Ratio)) and BER (Bit Error Rate). Further, whether performance quality of a downstream signal meets requirements of DOCSIS (Data-Over-Cable Service Interface Specification) PHY17H must be judged collaboratively by analog circuit engineers and digital circuit engineers, which is time-consuming.

On the other hand, in the above arrangement, the intermediate frequency AGC amplification circuit is provided in the tuner. This allows analog circuit engineers to design these components. This makes it possible to drastically reduce a time of tuning for getting the best performance and a time for the evaluation on DOCSIS.

Further, a cable modem according to the present invention includes:

a tuner for transmitting and receiving an analog signal to and from a communication line; and a signal processing section for performing modulation and demodulation of transmitted and received signals to and from the tuner, the tuner including:

a reception processing section for receiving a signal transmitted from the communication line; and a return path circuit for transmitting to the communication line a signal transmitted from the signal processing section, the return path circuit including a return path amplification circuit for performing power amplification of a signal transmitted from the signal processing section.

According to the above arrangement, it is possible to provide a cable modem of small size and excellent transmission characteristic.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A tuner for use in a cable modem, comprising:
   a reception processing section for receiving a signal transmitted from a communication line; and
   a return path circuit for transmitting to the communication line a signal transmitted from a signal processing section,
   the return path circuit including a return path amplification circuit for performing power amplification of a signal transmitted from the signal processing section,
   wherein the cable modem includes the tuner for transmitting and receiving an analog signal to and from the communication line and the signal processing section for performing modulation and demodulation with respect to a signal transmitted and received by the tuner, the tuner and the signal processing section being formed on different boards.

2. The tuner according to claim 1, wherein the return path circuit comprises a filter for removing noise included in a signal transmitted from the signal processing section.

3. The tuner according to claim 1, wherein separate routes supply power to the return path amplification circuit and power to components other than the return path amplification circuit in the tuner.

4. The tuner according to claim 1, wherein circuits constituting the reception processing section and the return path circuit are provided on one surface of a board.

5. The tuner according to claim 1, wherein the return path circuit includes a balanced-to-unbalanced conversion transformer for converting a balanced output from the return path amplification circuit to an unbalanced output and a matching inductor which is provided on an output side of the balanced-to-unbalanced conversion transformer.

6. The tuner according to claim 1, wherein the return path circuit is surrounded by a partition member having electrical and electromagnetic shielding effect.

7. The tuner according to claim 1, wherein the reception processing section includes a PLL circuit used in performing frequency conversion and a DC-DC converter as a regulator for supplying power to the PLL circuit, and
   the DC-DC converter is surrounded by a partition member having electrical and electromagnetic shielding effect.

8. The tuner according to claim 1, wherein the reception processing section performs reception processing in accordance with a single conversion system for converting a frequency of a received signal into an intermediate frequency, and includes an intermediate frequency AGC amplification circuit for amplifying an intermediate frequency signal in accordance with an IF AGC signal transmitted from the signal processing section.

9. A cable modem comprising:

a tuner for transmitting and receiving an analog signal to and from a communication line; and a signal processing section for performing modulation and demodulation of transmitted and received signals to and from the tuner, the tuner including a reception processing section for receiving a signal transmitted from the communication line; and a return path circuit for transmitting to the communication line a signal transmitted from the signal processing section, the return path circuit including a return path amplification circuit for performing power amplification of a signal transmitted from the signal processing section, wherein the tuner and the signal processing section are formed on different boards.

10. The tuner according to claim 1, wherein the return path amplification circuit includes a preamplifier, a digital gain control circuit, and a power amplification circuit.

11. The cable modem according to claim 9, wherein the return path amplification circuit includes a preamplifier, a digital gain control circuit, and a power amplification circuit.

* * * * *